United States Patent
Bhawnani et al.

(10) Patent No.: US 9,934,349 B2
(45) Date of Patent: Apr. 3, 2018

(54) METHOD FOR VERIFYING DESIGN RULE CHECKS

(71) Applicant: FREESCALE SEMICONDUCTOR, INC., Austin, TX (US)

(72) Inventors: Inder Mohan Bhawnani, Gwalior (IN); Ertugrul Demircan, Eugene, OR (US); Dwarka Prasad, Noida (IN); Douglas M. Reber, Austin, TX (US); Donald E. Smeltzer, Austin, TX (US); Kenneth J. Danti, Austin, TX (US)

(73) Assignee: NXP USA, INC., Austin, TX (US)

( * ) Notice: Subject to any disclaimer, the term of this patent is extended or adjusted under 35 U.S.C. 154(b) by 351 days.

(21) Appl. No.: 14/669,697

(22) Filed: Mar. 26, 2015

(65) Prior Publication Data
US 2016/0283642 A1  Sep. 29, 2016

(51) Int. Cl.
*G06F 9/455* (2018.01)
*G06F 17/50* (2006.01)

(52) U.S. Cl.
CPC .............. *G06F 17/5081* (2013.01)

(58) Field of Classification Search
USPC ........................................ 716/111
See application file for complete search history.

(56) References Cited

U.S. PATENT DOCUMENTS

| | | | |
|---|---|---|---|
| 6,063,132 A * | 5/2000 | DeCamp | G06F 17/5081 716/112 |
| 6,732,338 B2 * | 5/2004 | Crouse | G06F 17/5081 716/112 |
| 7,823,103 B2 | 10/2010 | Pokorny | |
| 2014/0282329 A1 | 9/2014 | Aggarwal et al. | |

* cited by examiner

*Primary Examiner* — Eric Lee

(57) ABSTRACT

A method for design rule verification is provided. The method comprises: providing a design rule check (DRC) deck based on a design rule manual (DRM) having a plurality of design rules; providing a plurality of primitive objects; creating a plurality of collection objects, each collection object using one or more primitive objects; using the plurality of collection objects, creating a plurality of DRM test cases; assigning names to each of the plurality of DRM test cases, each of the names based on a rule name of the plurality of design rules and on an expected pass or fail indication; and using the plurality of named DRM test cases to verify the DRC deck.

20 Claims, 2 Drawing Sheets

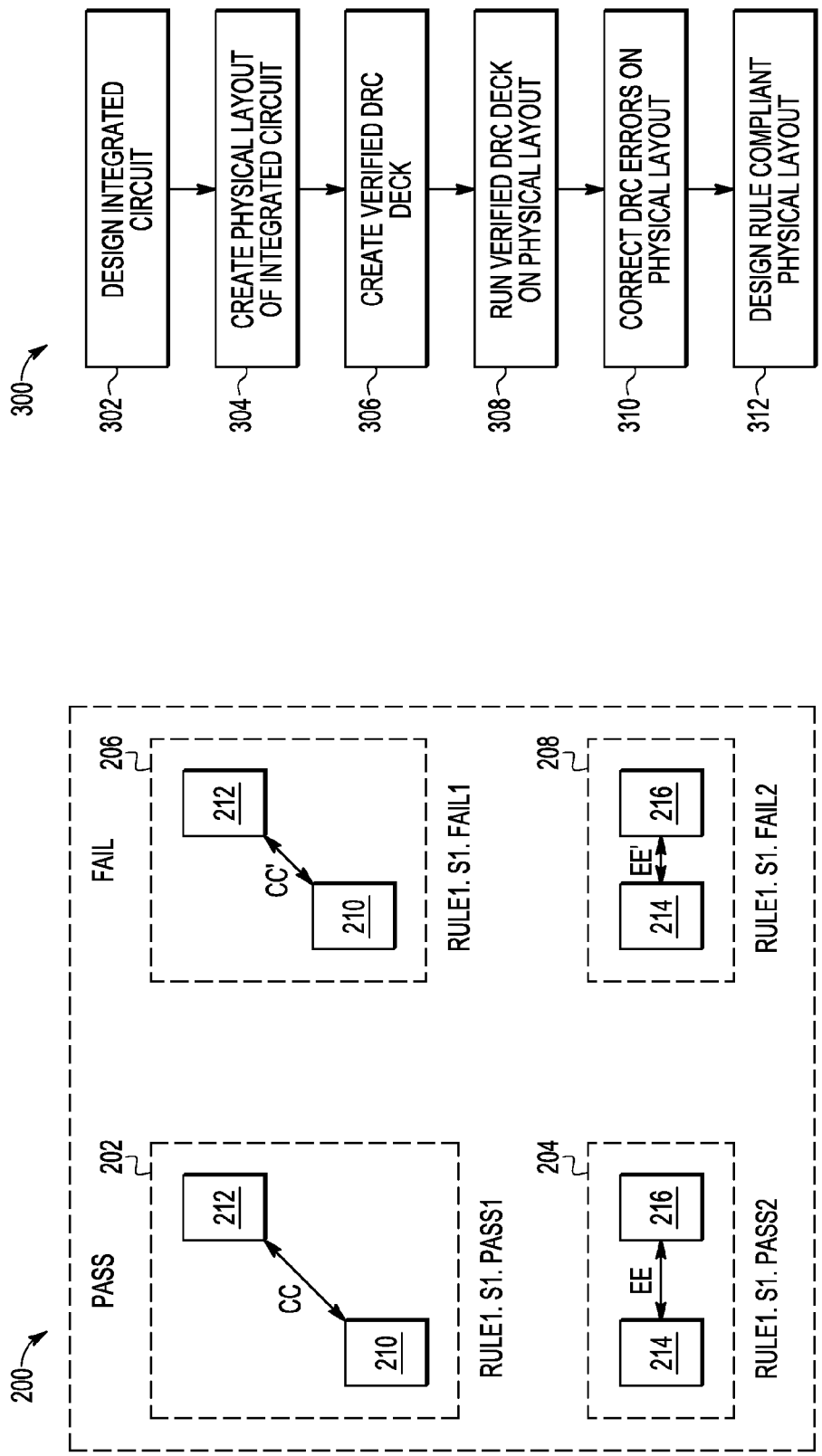

METHOD FOR VERIFYING DESIGN RULE CHECKS

BACKGROUND

Field

This disclosure relates generally to semiconductor device design verification, and more specifically, to a method for verifying design rule checks.

Related Art

As semiconductor process technology advances, semiconductor device fabrication costs increase sharply. Fabrication of a semiconductor device involves generation of a physical layout for the device. Design rule checks or design rule checking (DRC) of the physical layout is a critical step in the fabrication of the semiconductor device. DRCs are typically used with a computer aided design (CAD) tool to verify compliance of a set of design rules on a physical layout for characteristics such as, for example, size and spacing. The physical layout may be used in generating masks for fabrication of the semiconductor device. The cost for set of masks used to fabricate a semiconductor device in an advanced technology may exceed $1,000,000.00. Therefore, it is important to verify design rule checks.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 2 is a block diagram of a combined database of test cases in accordance with an embodiment of the present disclosure.

FIG. 3 is a flow diagram for creating a design rule compliant physical layout of an integrated circuit in accordance with an embodiment of the present disclosure.

DETAILED DESCRIPTION

Figure 1:
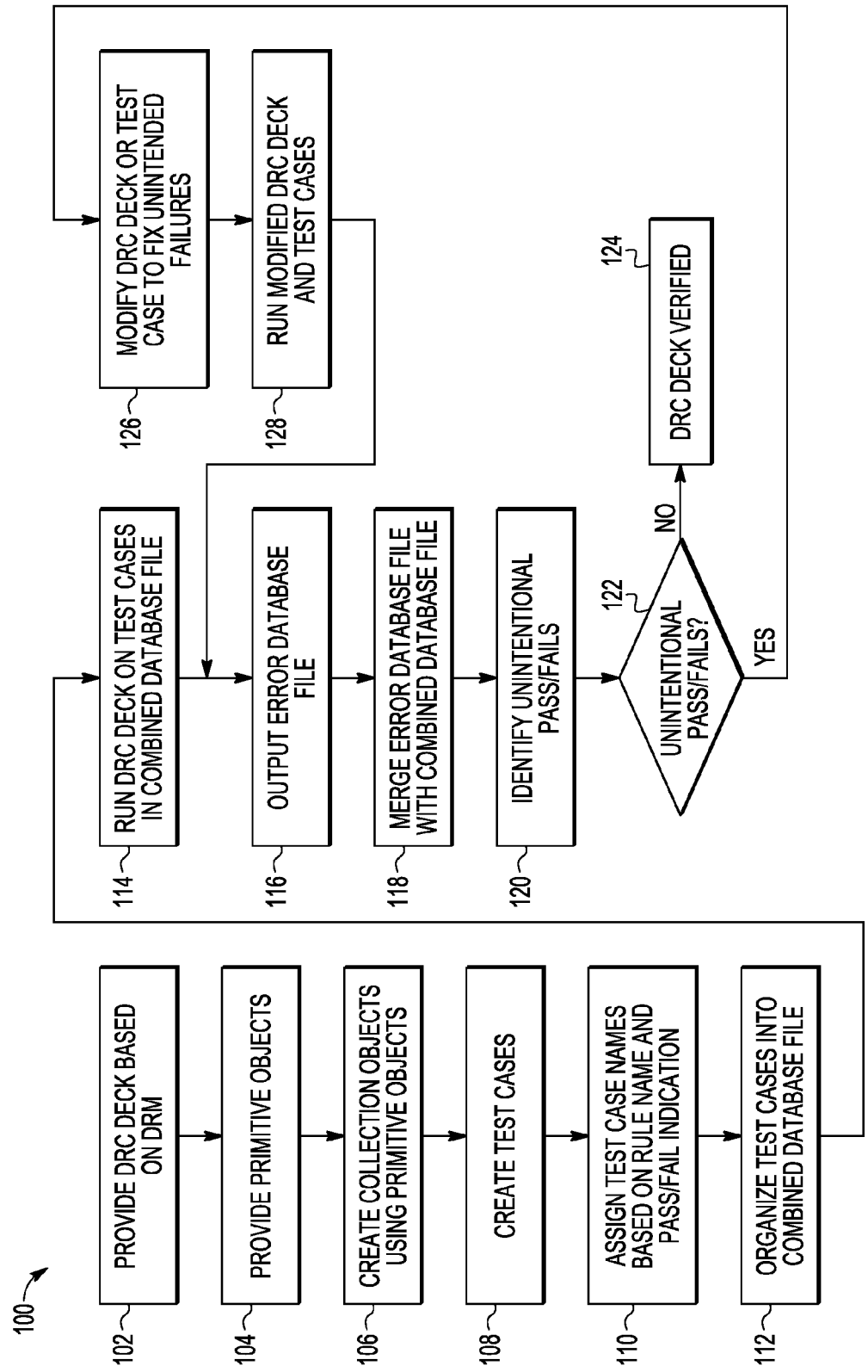
FIG. 1 is a flow diagram for creating a verified DRC deck in accordance with an embodiment of the present disclosure.

The present disclosure describes a method for verifying a set of design rule checks (DRC). The set of DRCs can be referred to as a DRC deck. The DRC deck is created based on a design rule manual (DRM). The DRM includes a set of rules for a specific semiconductor process technology. The DRM is useful as a guideline to designers of a semiconductor device such as an integrated circuit, for example. Adherence to the design rules in the DRM will generally allow for a functional semiconductor device to be produced having acceptable yield. The method described herein includes generation of physical layout test cases based on the DRM which may facilitate verification of the DRC deck.

FIG. 1 is a flow diagram 100 for creating a verified DRC deck in accordance with an embodiment of the present disclosure. DRC decks are typically derived from a design rule manual (DRM) and used to check physical layout for compliance with design rules.

At step 102, a DRC deck based on a DRM is provided. The DRM is generally a document containing a plurality of design rules describing physical layout constraints. In other words, the DRM may include a set of rules which provide guidelines such as width and space of conductors, for example, that when followed, can allow for a functional integrated circuit. The DRC deck includes a plurality of checks to ensure compliance for the design rules of the DRM.

At step 104, one or more primitive objects are provided. Primitive objects may include shapes, such as square, rectangle, L-shape, cross, bevel, and the like for example. A bevel shape is generally an orthogonal shape with one side having an angled line that does not intersect other lines at 90 degrees. Primitive objects are used to form shapes for measurements such that compliance of design rules can be determined. Primitive objects may be used for design rules including spacing, width, area, enclosed area, overlap distance, enclosure distance, and the like. Primitive objects may also be used to form complex shapes for measurements that may include multiple layers for example.

At step 106, one or more collection objects are created based on the one or more primitive objects. Collection objects are an arrangement of a plurality of primitive objects and allow for measurements between or among primitive objects such that compliance of design rules can be determined. For example, a collection object may include two primitive objects spaced apart by a predetermined distance. The distance between the primitive objects may be useful to determine whether a spacing design rule is accurate.

At step 108, one or more DRM test cases are created using one or more collection objects. A DRM test case may include one or more collection objects and/or primitive objects, with fixed geometrical values aligned with specific rule values. One or more test cases may correspond to one or more rules in the DRM and can be used to verify the one or more rules.

At step 110, each test case is assigned a name. Each of the names is based on a rule name of the plurality of design rules in the DRM. Each of the names is also based on an expected pass/fail indication. The assigned names of the test cases may follow a naming convention to facilitate accurate DRC verification.

At step 112, one or more test cases are organized in a combined database file after names are assigned to test cases. The combined database file may include the test cases arranged spatially such that shapes within each test case do not overlap.

At step 114, the DRC deck is run on the named test cases in the combined database file. The design rules specified in the DRC deck are checked on the physical layout of the named test cases. For example, the DRC deck and the combined database files may be loaded into a DRC CAD tool which performs specified DRC checks on the named test cases. The DRC deck may be run using a commercially available CAD tool such as Mentor Graphics Calibre, Cadence PVS, Synopsys IC Validator, and the like.

At step 116, DRC deck run results are collected into an error database file. The error database file includes DRC deck run failures. The failures maybe identified by rule name and coordinates or extents of the failure location within the test case.

At step 118, the error database file and the combined database file are merged. In addition to the test cases, the merged databases include may include shapes from the error database which indicate a failure point or region of the test cases.

At step 120, the merged database is used to identify unintentional pass/fail failures. An unintentional pass/fail failure may include, for example, a DRC run on a test case that passes when a failure is expected. Similarly, an unintentional pass/fail failure may include a DRC run on a test case that fails when a pass is expected.

At step 122, determine whether unintentional pass/fail failure(s) exist in the error database file. If one or more unintentional pass/fail failure(s) exist (yes), then continue at step 126. If unintentional pass/fail failure(s) do not exist (no), then end at step 124 and the DRC deck is determined to be verified.

At step 126, the DRC deck and/or test case(s) are fixed to eliminate identified unintentional failure(s). In some situations, when an unintentional failure is found, the DRC deck may need to be modified to fix the unintentional failure. In some situations, when an unintentional failure is found, the test case may need to be modified to fix the unintentional failure. In some situations, both DRC deck and test case may need to be modified to fix the unintentional failure.

At step 128, once the DRC deck and/or test case(s) are modified, a DRC run is performed and the flow returns at step 116. If the DRC deck was modified, the DRC run would use the modified DRC deck. And if the test case was modified, then the DRC run would be on the modified test case.

FIG. 2 is a block diagram illustrating a combined database 200 including four exemplary test cases 202-208 in accordance with an embodiment of the present disclosure. In this embodiment, test cases 202-208 are used for verifying one spacing DRC. Test cases 202 and 204 may be used to check a spacing which results in a pass. Test cases 206 and 208 may be used to check a spacing which results in a fail.

Test case 202 includes two polygon shapes 210 and 212 arranged for verifying that a corner-to-corner CC spacing between the two polygon shapes 210 and 212 is greater than or equal to a minimum spacing design rule. Shape 212 is drawn on a diagonal from shape 210 and spaced at a minimum corner-to-corner rule distance value apart. When a DRC deck including the minimum corner-to-corner rule is run on test case 202, a pass result is expected. Shape 210 may be formed on a first drawing layer. Shape 212 may be formed on the first drawing layer or a second drawing layer.

Test case 206 includes two polygon shapes 210 and 212 arranged for verifying that a corner-to-corner CC' spacing between the two polygon shapes 210 and 212 is greater than or equal to a minimum spacing design rule. Shape 212 is drawn on a diagonal from shape 210. However, shape 212 is spaced at a distance value less than the minimum corner-to-corner rule distance value apart from shape 210. The corner-to-corner CC' spacing in test case 206 may be as small as one design grid point smaller than the design rule value in order to detect an expected failure. A design grid point is generally the smallest division of a grid used to create masks for a given technology node. For example, a design grid point may be one nanometer. When a DRC deck including the minimum corner-to-corner rule is run on test case 206, a fail result is expected. Shape 210 may be formed on a first drawing layer. Shape 212 may be formed on the first drawing layer or a second drawing layer.

Test case 204 includes two polygon shapes 214 and 216 arranged for verifying that an edge-to-edge EE spacing between the two polygon shapes 214 and 216 is greater than or equal to a minimum spacing design rule. Shape 216 is drawn at a minimum edge-to-edge rule distance value apart from shape 214. When a DRC deck including the minimum edge-to-edge rule is run on test case 204, a pass result is expected. Shape 214 may be formed on a first drawing layer. Shape 216 may be formed on the first drawing layer or a second drawing layer.

Test case 208 includes two polygon shapes 214 and 216 arranged for verifying that an edge-to-edge EE' spacing between the two polygon shapes 214 and 216 is greater than or equal to a minimum spacing design rule. Shape 216 is spaced at a distance value less than the minimum edge-to-edge EE' rule distance value apart from shape 214. The edge-to-edge EE' spacing in test case 208 may be as small as one grid point smaller than the design rule value in order to detect an expected failure. When a DRC deck including the minimum edge-to-edge EE' rule is run on test case 208, a fail result is expected. Shape 214 may be formed on a first drawing layer. Shape 216 may be formed on the first drawing layer or a second drawing layer.

The test cases of the combined database 200 are each named based on the rule and include an expected pass/fail indication. An exemplary test case naming convention may be in the form RULENAMEx.MEASUREy.PASS/FAILz. The test case names in the combined database 200 are shown according to the exemplary naming convention. Test case 202 is named RULE1.S1.PASS1. The test case 202 name can be interpreted as a test case for verifying a first spacing requirement (S1) for a first rule (RULE1) having a first expected pass indication (PASS1). Test case 204 is named RULE1.S1.PASS2. The test case 204 name can be interpreted as a test case for verifying a first spacing requirement (S1) for a first rule (RULE1) having a second expected pass indication (PASS2). Test case 206 is named RULE1.S1.FAIL1. The test case 206 name can be interpreted as a test case for verifying a first spacing requirement (S1) for a first rule (RULE1) having a first expected fail indication (FAIL1). Test case 208 is named RULE1.S1.FAIL2. The test case 208 name can be interpreted as a test case for verifying a first spacing requirement (S1) for a first rule (RULE1) having a second expected fail indication (FAIL2).

FIG. 3 is a design flow diagram 300 illustrating design rule compliant physical layout for an integrated circuit in accordance with an embodiment of the present disclosure.

At step 302, an integrated circuit is designed. The integrated circuit may include a processor, memory, peripherals, synthesized logic, custom circuitry, analog circuitry, input/output (I/O) pads, electrostatic discharge (ESD) structures, and the like.

At step 304, physical layout of the integrated circuit is created. Physical layout is based on the integrated circuit's semiconductor process technology parameters such as width, space, and the like from a DRM. Physical layout may be automated, place and routed, custom hand-crafted, and the like. The physical layout may be in the form of a GDSII database or in the form of a proprietary database recognized by one or more CAD tools.

At step 306, a DRC deck based on the DRM is verified according to the method described for FIG. 1. A plurality of test cases based on the DRM is used to verify the DRC deck.

At step 308, once the DRC deck is verified, the verified DRC deck is run on the physical layout of the integrated circuit. The DRC deck may be run using a commercially available tool such as Mentor Graphics Calibre, Cadence Assura, Synopsys IC Validator, and the like. Physical layout which violates checks in the DRC deck will be identified or flagged as errors.

At step 310, errors identified in the DRC deck run are corrected in the physical layout. For example, adjusting the width of a conductor in the physical layout may be needed to correct of an identified conductor width rule violation. Once all of the errors are corrected in the physical layout, a design rule compliant physical layout is determined at step 312. In some embodiments, the DRC deck is run on the corrected physical layout to determine whether all of the errors were corrected and to determine that no additional errors were created.

Generally, there is provided, a method for design rule verification, including: providing a design rule check deck based on a design rule manual (DRM) having a plurality of design rules; providing a plurality of primitive objects; creating a plurality of collection objects, each collection object using one or more primitive objects; using the plurality of collection objects, creating a plurality of DRM test cases; assigning names to each of the plurality of DRM test cases, each of the names based on a rule name of the plurality of design rules and on an expected pass or fail indication; and using the plurality of named DRM test cases to verify the design rule check deck. The method may further include organizing the plurality of named DRM test cases into a combined database file after assigning names to each of the plurality of DRM test cases. The method may further include running the design rule check deck on the DRM test cases in the combined database file. The method may further include outputting an error database file as a result of running the design rule check deck on the design rule manual test cases in the combined database file. The method may further include: merging the error database file with the combined database file; and identifying any unintentional failures in the error database file. The method may further include: determining that there is an unintentional error in the error database file; modifying the design rule check deck or test cases to correct the unintended failure; running the modified design rule check deck and test cases; outputting another error database file merged with the combined database file; identifying that there are no other unintentional failures; and determining that the design rule check deck is verified. The verified design rule check deck may be used to create a design rule compliant physical layout for an integrated circuit. Providing a plurality of primitive objects may include providing one or more of a square, rectangle, L-shape, or bevel shape. Creating a plurality of DRM test cases may include creating a test case for verifying that an edge spacing between two shapes is greater than or equal to a minimum spacing.

In one embodiment, there is provided, a method for design rule verification, including: providing a design rule check deck based on a design rule manual (DRM) having a plurality of design rules; providing a plurality of primitive objects; creating a plurality of collection objects, each collection object using one or more primitive objects; using the plurality of collection objects, creating a plurality of DRM test cases; assigning names to each of the plurality of DRM test cases, each of the names based on a rule name of the plurality of design rules and on an expected pass or fail indication; organizing the plurality of named DRM test cases into a combined database file; running the design rule check deck on the named DRM test cases in the combined database file; outputting an error database file as a result of running the design rule check deck on the design rule manual test cases in the combined database file; merging the error database file with the combined database file; identifying any unintentional failures in the error database file; correcting the errors set out in the error database file; and determining that the design rule check deck is verified. Outputting an error database file and correcting the errors set out in the error database file may further include: determining that there is an unintentional error in the error database file; modifying the design rule check deck or test cases to correct the unintended failure; running the modified design rule check deck and test cases; outputting another error database file merged with the combined database file; and identifying that there are no other unintentional failures. The verified design rule check deck may be used to create a design rule compliant physical layout for an integrated circuit. Providing a plurality of primitive objects may include providing one or more of a square, rectangle, L-shape, or bevel shape. Creating a plurality of DRM test cases may include creating a test case for verifying that an edge spacing between two objects is greater than or equal to a minimum spacing. Creating a plurality of DRM test cases may include creating a test case for verifying that a corner-to-corner spacing between two objects is greater than or equal to a minimum spacing.

In another embodiment, there is provided, a method for design rule verification, including: providing a design rule check deck based on a design rule manual (DRM) having a plurality of design rules; providing a plurality of primitive objects; creating a plurality of collection objects, each collection object using one or more primitive objects; using the plurality of collection objects, creating a plurality of DRM test cases; assigning names to each of the plurality of DRM test cases, each of the names based on a rule name of the plurality of design rules and on an expected pass or fail indication; organizing the plurality of named DRM test cases into a combined database file; running the design rule check deck on the named DRM test cases in the combined database file; determining that there is at least one unintentional error in the error database file; modifying the design rule check deck or test cases to correct the at least one unintended failure; running the modified design rule check deck and test cases; outputting another error database file merged with the combined database file; identifying that there are no other unintentional failures; correcting the errors set out in the error database file; and determining that the design rule check deck is verified. The verified design rule check deck may be used to create a design rule compliant physical layout for an integrated circuit. Providing a plurality of primitive objects may include providing one or more of a square, rectangle, L-shape, or bevel shape. Creating a plurality of DRM test cases may include creating a test case for verifying that an edge spacing between two objects is greater than or equal to a minimum spacing. Creating a plurality of DRM test cases may include creating a test case for verifying that a corner-to-corner spacing between two objects is greater than or equal to a minimum spacing.

By now it should be appreciated that there has been provided a method which can be used to verify a DRC deck by using generated test cases based on a DRM, and running a DRC test using the DRC deck on the generated test cases.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that boundaries between the functionality of the above described steps or operations are merely illustrative. The functionality of multiple step may be combined into a single step, and/or the functionality of a single step may be distributed in additional steps. Moreover, alternative embodiments may include multiple instances of a particular step or operation, and the order of steps may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for design rule verification, the method comprising:
   providing a design rule check deck based on a design rule manual (DRM) having a plurality of design rules;
   providing a plurality of primitive objects;
   creating a plurality of collection objects, each collection object using one or more primitive objects;
   using the plurality of collection objects, creating a plurality of DRM test cases;
   assigning names to each of the plurality of DRM test cases, each of the names following a naming convention that includes a rule name of the plurality of design rules and an expected pass or fail indication within each of the names;
   using the plurality of named DRM test cases to verify the design rule check deck; and
   manufacturing an integrated circuit based on the verified design rule check deck.

2. The method of claim 1, further comprising organizing the plurality of named DRM test cases into a combined database file after assigning names to each of the plurality of DRM test cases.

3. The method of claim 2, further comprising running the design rule check deck on the DRM test cases in the combined database file.

4. The method of claim 3, further comprising outputting an error database file as a result of running the design rule check deck on the design rule manual test cases in the combined database file.

5. The method of claim 4, further comprising:
   merging the error database file with the combined database file; and
   identifying any unintentional failures in the error database file.

6. The method of claim 5, further comprising:
   determining that there is an unintentional error in the error database file;
   modifying the design rule check deck or test cases to correct the unintended failure;
   running the modified design rule check deck and test cases;
   outputting another error database file merged with the combined database file;
   identifying that there are no other unintentional failures; and
   determining that the design rule check deck is verified.

7. The method of claim 6, wherein the verified design rule check deck is used to create a design rule compliant physical layout for an integrated circuit.

8. The method of claim 1, wherein providing a plurality of primitive objects comprises providing one or more of a square, rectangle, L-shape, or bevel shape.

9. The method of claim 1, wherein creating a plurality of DRM test cases comprises creating a test case for verifying that an edge spacing between two shapes is greater than or equal to a minimum spacing.

10. A method for design rule verification, the method comprising:
    providing a design rule check deck based on a design rule manual (DRM) having a plurality of design rules;
    providing a plurality of primitive objects;
    creating a plurality of collection objects, each collection object using one or more primitive objects;
    using the plurality of collection objects, creating a plurality of DRM test cases;
    assigning names to each of the plurality of DRM test cases, each of the names following a naming convention that includes a rule name of the plurality of design rules and an expected pass or fail indication within each of the names;
    organizing the plurality of named DRM test cases into a combined database file;
    running the design rule check deck on the named DRM test cases in the combined database file;
    outputting an error database file as a result of running the design rule check deck on the design rule manual test cases in the combined database file;
    merging the error database file with the combined database file;
    identifying any unintentional failures in the error database file;
    correcting the errors set out in the error database file;
    determining that the design rule check deck is verified; and
    manufacturing an integrated circuit based on the verified design rule check deck.

11. The method of claim 10, wherein outputting an error database file and correcting the errors set out in the error database file further comprises:
    determining that there is an unintentional error in the error database file;
    modifying the design rule check deck or test cases to correct the unintended failure;
    running the modified design rule check deck and test cases;
    outputting another error database file merged with the combined database file; and
    identifying that there are no other unintentional failures.

12. The method of claim 10, wherein the verified design rule check deck is used to create a design rule compliant physical layout for an integrated circuit.

13. The method of claim 10, wherein providing a plurality of primitive objects comprises providing one or more of a square, rectangle, L-shape, or bevel shape.

14. The method of claim 10, wherein creating a plurality of DRM test cases comprises creating a test case for verifying that an edge spacing between two objects is greater than or equal to a minimum spacing.

15. The method of claim 10, wherein creating a plurality of DRM test cases comprises creating a test case for verifying that a corner-to-corner spacing between two objects is greater than or equal to a minimum spacing.

16. A method for design rule verification, the method comprising:
    providing a design rule check deck based on a design rule manual (DRM) having a plurality of design rules;
    providing a plurality of primitive objects;
    creating a plurality of collection objects, each collection object using one or more primitive objects;
    using the plurality of collection objects, creating a plurality of DRM test cases;
    assigning names to each of the plurality of DRM test cases, each of the names following a naming convention that includes a rule name of the plurality of design rules and an expected pass or fail indication within each of the names;
    organizing the plurality of named DRM test cases into a combined database file;
    running the design rule check deck on the named DRM test cases in the combined database file;
    determining that there is at least one unintentional error in the error database file;
    modifying the design rule check deck or test cases to correct the at least one unintended failure;
    running the modified design rule check deck and test cases;
    outputting another error database file merged with the combined database file;
    identifying that there are no other unintentional failures;
    correcting the errors set out in the error database file;
    determining that the design rule check deck is verified; and
    manufacturing an integrated circuit based on the verified design rule check deck.

17. The method of claim 16, wherein the verified design rule check deck is used to create a design rule compliant physical layout for an integrated circuit.

18. The method of claim 16, wherein providing a plurality of primitive objects comprises providing one or more of a square, rectangle, L-shape, or bevel shape.

19. The method of claim 16, wherein creating a plurality of DRM test cases comprises creating a test case for verifying that an edge spacing between two objects is greater than or equal to a minimum spacing.

20. The method of claim 16, wherein creating a plurality of DRM test cases comprises creating a test case for verifying that a corner-to-corner spacing between two objects is greater than or equal to a minimum spacing.

* * * * *